United States Patent
Ryu et al.

(10) Patent No.: US 8,426,228 B2
(45) Date of Patent: Apr. 23, 2013

(54) THIN-FILM TRANSISTOR SUBSTRATE, METHOD OF MANUFACTURING SAME AND DISPLAY APPARATUS HAVING SAME

(75) Inventors: Hye-Young Ryu, Seoul (KR); Hyang-Shik Kong, Seongnam-si (KR); Byung-Duk Yang, Yongin-si (KR); Kyung-Sook Jeon, Incheon (KR)

(73) Assignee: Samsung Display Co., Ltd. (KR)

( * ) Notice: Subject to any disclaimer, the term of this patent is extended or adjusted under 35 U.S.C. 154(b) by 29 days.

(21) Appl. No.: 13/181,403

(22) Filed: Jul. 12, 2011

(65) Prior Publication Data

US 2011/0269254 A1    Nov. 3, 2011

Related U.S. Application Data

(62) Division of application No. 12/195,974, filed on Aug. 21, 2008, now Pat. No. 7,989,807.

(30) Foreign Application Priority Data

Sep. 4, 2007 (KR) .......................... 10-2007-0089370

(51) Int. Cl.
*H01L 29/06* (2006.01)
*H01L 29/08* (2006.01)

(52) U.S. Cl.
USPC .................... 438/29; 438/30; 257/E33.012

(58) Field of Classification Search .................. 438/29, 438/30, 155; 257/E33.012
See application file for complete search history.

(56) References Cited

U.S. PATENT DOCUMENTS

| 2008/0042135 A1 | 2/2008 | Ryu et al. |
| 2008/0169473 A1 | 7/2008 | Cho |

FOREIGN PATENT DOCUMENTS

| KR | 1020050038116 A | 4/2005 |
| KR | 1020050066640 A | 6/2005 |
| KR | 1020060112042 A | 10/2006 |

*Primary Examiner* — Chuong A Luu
*Assistant Examiner* — Nga Doan
(74) *Attorney, Agent, or Firm* — Innovation Counsel LLP

(57) ABSTRACT

Contamination is blocked from material of a color filter layer provided on a thin-film transistors (TFT) supporting substrate by sealing over the color filter layer with an inorganic insulating layer. During mass production manufacture, a plasma surface cleaning step is employed after the color filter layer is deposited but before the inorganic insulating layer is deposited. A low temperature CVD process is used to deposit the inorganic insulating layer with a substantially uniform thickness conformably over the color filter layer including conformably into openings provided through the color filter layer.

5 Claims, 11 Drawing Sheets

THIN-FILM TRANSISTOR SUBSTRATE, METHOD OF MANUFACTURING SAME AND DISPLAY APPARATUS HAVING SAME

CROSS-REFERENCE TO RELATED APPLICATIONS

This application is a divisional application of U.S. patent application Ser. No. 12/195,974, filed on Aug. 21, 2008, which parent application claims benefit under 35 U.S.C. §119 of Korean Patent Application No. 2007-0089370, filed on Sep. 4, 2007 in the Korean Intellectual Property Office (KIPO), the disclosures of which applications are herein incorporated by reference in their entireties.

BACKGROUND

1. Field of Invention

The present disclosure of invention relates to a display apparatus and, more particularly, to a TFT substrate, a method of manufacturing the TFT substrate and a display apparatus having the TFT substrate.

2. Description of Related Technology

Recently, flat panel displays, such as organic light-emitting displays (OLED's), plasma display panels (PDP's) and liquid crystal displays (LCD's) have been developed as substitutes for heavy and large cathode ray tube (CRT) displays. A PDP displays images using plasma generated by electric discharges. An OLED displays images and characters using an organic electroluminescence property of a specific organic material and/or of a polymer. A LCD displays images by controlling the transmissivity of light passing through a liquid crystal layer.

In general, the LCD includes a thin-film transistors (TFT) supporting substrate, a common electrode supporting substrate spaced apart from the TFT substrate and a liquid crystal layer disposed between the TFT substrate and the common electrode substrate. If the TFT substrate and the common electrode substrate become misaligned relative to one another during a mass production manufacturing process, the display quality of the LCD can be adversely affected.

In order to prevent display quality from being significantly affected adversely by substrate-to-substrate misalignment, a color filter on array (COA) structure has been proposed in which color filters that are normally on the common electrode substrate are instead disposed on the TFT substrate. However, if the COA structure is used, impurities from the color filters may elute through gaps or openings between pixel electrodes and contaminate the liquid crystal layer thereby causing undesirable afterimages to be displayed.

Furthermore, when an organic insulating layer is used as a planarization layer under the pixel electrode, impurities from the organic insulating layer may elute into the liquid crystal layer. As a result, the liquid crystal is also contaminated, and the afterimage problem increases.

SUMMARY

According to one aspect of the present disclosure, a thin film transistor (TFT) substrate having a color filter on array (COA) structure is provided and it is capable of reducing defects such as afterimages attributed to the COA structure. The TFT substrate includes a gate electrode, a gate insulating layer, a semiconductor layer, a source electrode, a drain electrode, an organic layer, an inorganic insulating layer, a light blocking material, and a pixel electrode. The gate electrode is formed on the TFT substrate, and is electrically connected to a gate line. The gate insulating layer is formed on the substrate to cover the gate line and the gate electrode. The semiconductor layer is formed on the gate insulating layer corresponding to the gate electrode. The source electrode is electrically connected to a data line formed on the gate insulating layer in a direction crossing a longitudinal direction of the gate line. The source electrode is provided on the semiconductor layer. The drain electrode is also provided on the semiconductor layer and it is spaced apart from the source electrode so as to define a channel area of the semiconductor layer between the source and drain electrodes. The organic layer is formed on the gate insulating layer to cover the source electrode, the drain electrode, and the data line. The organic layer has a first opening exposing the channel area. The inorganic insulating layer is formed on the organic layer and an inner surface of the first opening, and has a substantially uniform thickness. A light blocking material is formed on the insulating layer and inside of the first opening with the inorganic insulating layer formed thereon. The pixel electrode is disposed on the inorganic insulating layer and light blocking material and electrically connected to the drain electrode.

According to a method of manufacturing, a TFT substrate is provided as follows. A gate line and a gate electrode electrically connected to the gate line are formed on a substrate. A gate insulating layer is formed on the substrate to cover the gate line and the gate electrode. A semiconductor layer is formed on the gate insulating layer corresponding to the gate electrode. A data line is formed on the gate insulating layer in a direction crossing an extended direction of the gate line, and a source electrode electrically connected to the data line and a drain electrode opposite to the source electrode are formed on the semiconductor layer to define a channel area of the semiconductor layer between the source and drain electrodes. An organic layer is formed on the gate insulating layer to cover the data line, the source electrode, and the drain electrode, and has a first opening exposing the channel area. An inorganic insulating layer is formed on the organic layer and an inner surface of the first opening, and has a substantially uniform thickness. A light blocking material is formed on the insulating layer and inside of the first opening with an inorganic insulating layer formed thereon. The pixel electrode is disposed on the inorganic insulating layer and light blocking material and electrically connected to the drain electrode.

According to still another aspect of the present disclosure, the display apparatus includes a first substrate, a gate electrode, a gate insulating layer, a semiconductor layer, a source electrode, a drain electrode, an organic layer, an inorganic insulating layer, a pixel electrode, and a second substrate. The gate electrode is disposed on the first substrate, and is electrically connected to a gate line. The gate insulating layer is disposed on the first substrate to cover the gate line and the gate electrode. The semiconductor layer is disposed on the gate insulating layer corresponding to the gate electrode. The source electrode is electrically connected to a data line formed on the gate insulating layer in a direction crossing a longitudinal direction of the gate line, and is on the semiconductor layer. The drain electrode is formed on the semiconductor layer, and is opposite to the source electrode to define a channel area of the semiconductor layer between the source and drain electrodes. The organic layer is disposed on the gate insulating layer to cover the source electrode, the data line, and the drain electrode. The organic layer has a first opening for exposing the channel area. The inorganic insulating layer is disposed on the organic layer and an inner surface of the first opening, and has a substantially uniform thickness. A light blocking material is formed on the insulating layer and inside of the first opening with an inorganic insulating layer formed thereon. The pixel electrode is disposed on the inorganic insulating layer and light blocking material and electrically connected to the drain electrode.

The second substrate faces the first substrate and includes a common electrode.

According to an aspect of the present disclosure, an inorganic insulating layer is disposed on an organic layer. Thus, impurities from the organic layer may be blocked, so that the liquid crystal may be prevented from being contaminated and display defects, such as image sticking, may be reduced.

According to a method of manufacturing a TFT substrate of the present disclosure, an inorganic insulating layer is formed at a low temperature of about 100° C. to about 250° C. Thus, damage to a lower organic layer may be prevented and display properties may be enhanced.

Additionally, according to a method of manufacturing a TFT substrate of the present disclosure, manufacturing time may be shortened by forming an inorganic insulating layer having a precise thickness.

BRIEF DESCRIPTION OF THE DRAWINGS

The above and other advantages of embodiments in accordance with the present disclosure will become readily apparent by reference to the following detailed description when considered in conjunction with the accompanying drawings, in which.

DETAILED DESCRIPTION

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Embodiments of the disclosure are described herein with reference to cross-section illustrations that are schematic illustrations of idealized embodiments (and intermediate structures) in accordance with the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

Hereinafter, exemplary embodiments in accordance with the present disclosure will be explained in detail with reference to the accompanying drawings.

Figure 1:
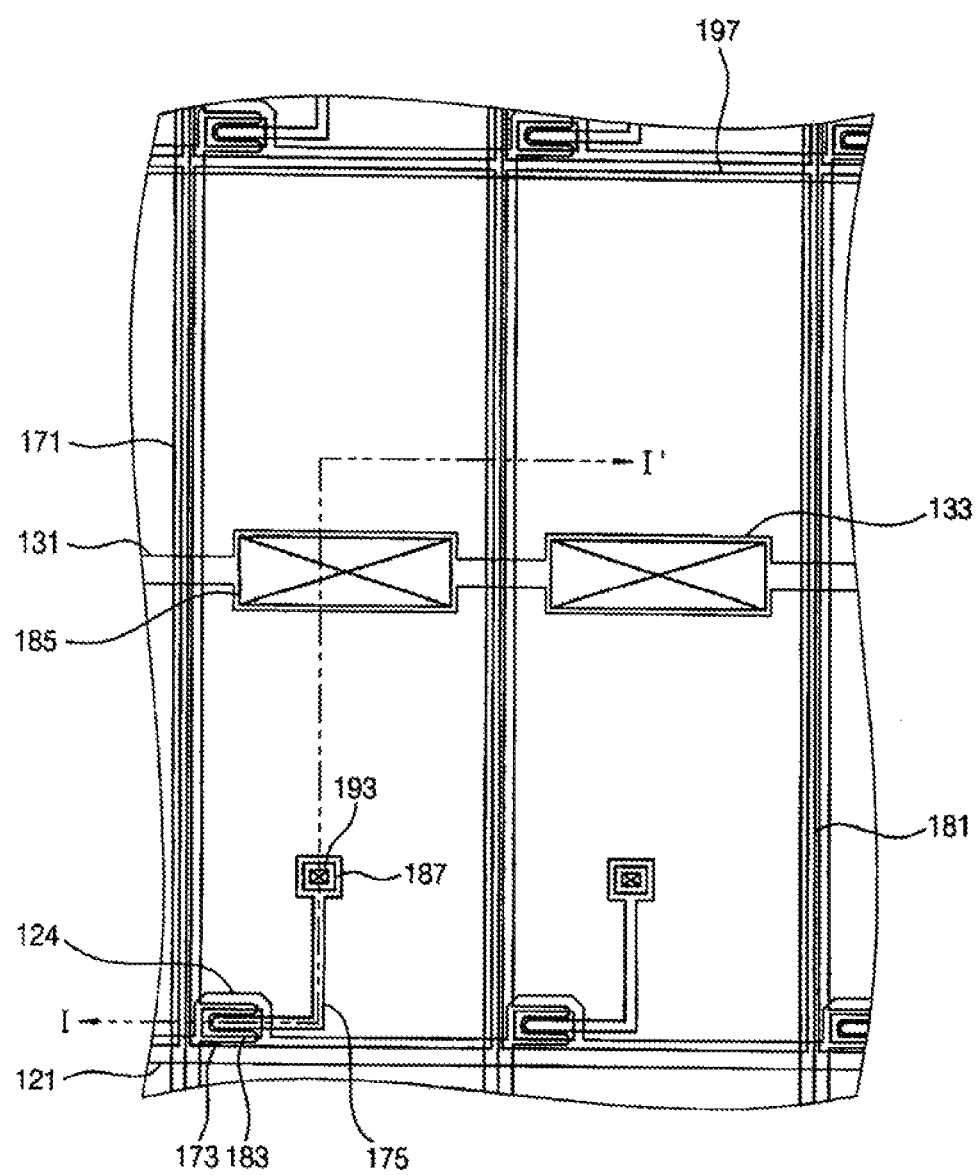
FIG. 1 is a plan view illustrating a portion of a thin-film transistor (TFT) substrate in accordance with a first exemplary embodiment of the present disclosure.
Figure 2:
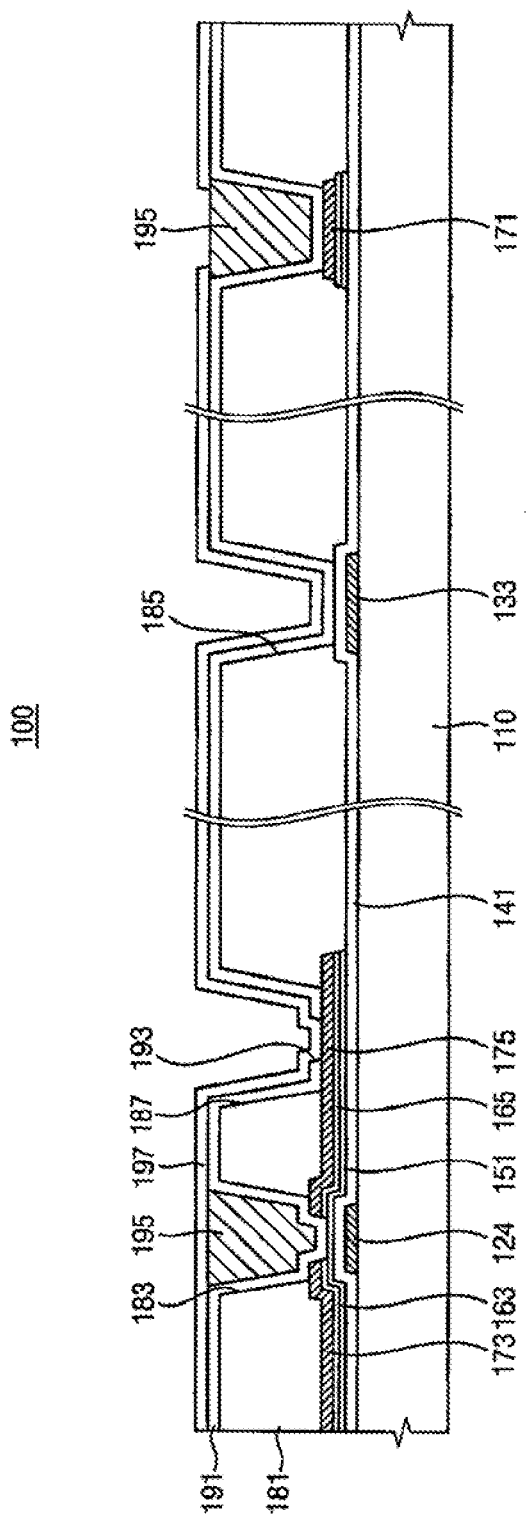
FIG. 2 is a cross-sectional view taken along a line I-I' in FIG. 1.

FIG. 1 is a plan view illustrating a portion of a thin-film transistor (TFT) substrate in accordance with a first exemplary embodiment of the present disclosure, and FIG. 2 is a cross-sectional view taken along a line I-I' in FIG. 1.

Referring to FIG. 1, a plurality of gate lines 121 are disposed on a light passing insulating substrate 110. The insulating substrate 110 includes, for example, a transparent glass or a transparent polymer.

The gate lines 121 are disposed along a horizontal first direction and carry gate signals. Each of the gate lines 121 has a gate electrode 124 branching from it and a gate pad (not shown). The gate electrode 124 protrudes from the gate lines 121 along a direction that is substantially perpendicular to the longitudinal first direction of the gate lines 121. The gate pad (contact pad) is disposed on an end portion of the gate lines so as to be electrically connected to a conductive pattern formed from a different layer or an external driving circuit.

A storage line 131 including a storage electrode 133 is formed from substantially the same layer as the gate lines 121. The storage electrode 133 may have various sizes and shapes as demands. For example, the storage electrode 133 in the present exemplary embodiment may have a rectangular shape on a central portion of each pixel electrode.

A plurality of orthogonally extending data lines 171 are formed after forming the gate lines. Source electrode 173 protrudes from the data lines 171 along a direction that is substantially perpendicular to the vertical second direction of the data lines 171. Drain electrode 175 is formed spaced apart from the source electrode 173 so as to define a channel therebetween.

The color filter 181 of each given pixel area does not cover the entire pixel area. Rather, the color filter 181 has a first opening 183 defined therethrough and located over the channel area. It has a second opening 185 defined therethrough and located in the area corresponding to the storage electrode 133. It has a third opening 187 defined therethrough and located in an area corresponding to the drain contact of drain electrode 175 and exposing the drain electrode 175.

The pixel electrode 197 is electrically connected to the drain electrode 175 through the third opening 187 of the color filter 181 and through a further opening 193 defined through an inorganic insulating layer 191; where the inorganic insulating layer 191 covers the color filter 181 so as to prevent leakage of contaminants from the color filter 181 to a liquid crystal layer that will be provided above pixel-electrode 197.

As better seen in FIG. 2, the gate electrode 124 is integrally formed during manufacture when forming the gate lines and gate electrode 124 protrudes from its gate line so as to lie under and insulatively spaced apart from the channel region of the later formed semiconductor layer. Storage capacitor electrodes 133 are formed (e.g., by patterned etching) at the same time that the gate lines and gate electrodes are formed. Gate insulating layer 141 is formed on the gate electrode. Semiconductor layer 151 which in one embodiment includes a hydrogenated amorphous silicon layer is formed on the gate insulating layer 141. Ohmic contact pattern 163, 165 is formed on the semiconductor layer to improve contact characteristic with the hydrogenated amorphous silicon layer. Source electrode 173 and drain electrode 175 are formed when forming the data lines. Source electrode 173 protrudes toward the gate electrode 124. The drain electrode 175 is separated from the data line 171, and faces the source electrode 173. The semiconductor pattern including the semiconductor layer, the ohmic contact layer and the source, drain electrodes can be formed by single photo-lithography mask process.

In a normal process, after forming the source, drain electrodes; a passivation layer is formed to directly contact the source, drain electrodes and thus protect them from external corrosive materials. By contrast, in this exemplary embodiment, the formation of a passivation layer directly on the source and drain electrodes is not carried out. Skipping the passivation deposition step at this point makes the process more simple and saves manufacturing cost.

Next, the color filter material (e.g., a pigmented polymer) is deposited on the substrate to cover the data lines and the source/drain electrodes formed thereon. Afterwards an inorganic insulating layer 191 will be formed (after the color filter layer is patterned) to cover the color filter material and thereby protect the later provided liquid crystal layer (not shown) from contaminants that can potentially elute out from the color filter material. The material of the inorganic insulating layer 191 is chosen to prevent such impurities of the color filter material from leaking out and contaminating the liquid crystal layer. The inorganic insulating layer 191 also functions as a passivation layer to prevent corrosive chemicals from reaching the source and drain electrodes (as well as the data and gate lines). Opening 193 is made in the inorganic insulating layer 191 for allowing connection of the drain electrode with the pixel electrode. Inside of first opening 183 formed through the color filter layer 181, a light blocking material 195 is deposited to block leakage of light through areas of the liquid crystal layer that are not controlled by the pixel-electrode. The light blocking material 195 is patterned to extend over the channel portion (above gate 124) and also over the data lines 171. Pixel electrode 197 is formed on the combination of the inorganic insulating material 191 and the light blocking material 195. Recall that the first opening 183 is needed so that the space between the spaced apart source and drain electrodes (173, 175) can be passivated. However, the pixel-electrode should be consistently spaced apart from the common electrode. Because the inside of the first opening 183 is filled with and thus planarized by the light blocking material 195, the pixel electrode can be formed as a planar structure over the channel portion. The light blocking material 195 can also be formed on a portion of the data lines 171.

Still referring to FIG. 2, during manufacture, a gate insulating layer 141 is formed on the gate electrodes and storage electrodes. A channel layer including a semiconductor layer 151 and ohmic contact members 163 and 165 are formed on the gate insulating layer 141.

The ohmic contact members 163 and 165 are disposed on the semiconductor layer 151. The ohmic contact members 163 and 165 are disposed between the semiconductor layer 151 and a source electrode 173. The ohmic contact members 163 and 165 decrease electric contact resistance between the semiconductor layer 151 and the source electrode 173. The ohmic contact members 163 and 165 are also disposed between the semiconductor layer 151 and a drain electrode 175. The ohmic contact members 163 and 165 decrease electric contact resistance between the semiconductor layer 151 and the drain electrode 175.

The data line 171 and the drain electrode 175 are disposed on the ohmic contact members 163 and 165.

The data line 171 transmits data signals and is disposed along a substantially perpendicular direction to cross with the gate lines 121. The data line 171 is electrically connected to the source electrode 173 and a data pad (not shown). The source electrode 173 protrudes toward the gate electrode 124. The data pad connected to the conductive pattern formed from the different layer or the external driving circuit is disposed on the end portion of the data line 171. The drain electrode 175 is separated from the data line 171, and faces the source electrode 173. The gate electrode 124 is disposed between the drain electrode 175 and the source electrode 173 when viewed on a plane.

The TFT includes the gate electrode 124, the source electrode 173, the drain electrode 175 and a protruding portion of the semiconductor layer 151. A channel of the TFT is formed between the source electrode 173 and the drain electrode 175.

The semiconductor layer 151 has substantially the same shape as the area defined by the data line 171, the drain electrode 175 and ohmic contact layers 163 and 165 under the data line 171 and the drain electrode 175, except for the protruding portion having the TFT. For example, the semiconductor layer 151 is disposed under the data line 171, the drain electrode 175 and ohmic contact layers 163 and 165 that are under the data line 171 and the drain electrode 175. The semiconductor layer 151 is exposed between the source electrode 173 and the drain electrode 175. The ohmic contact layers 163 and 165 have substantially the same shape as an area defined by the data line 171 and the drain electrode 175 when viewed on the plane.

As mentioned, in a normal process, a passivation layer would have been formed directly on the substrate data line, the source electrode, over the channel and the drain electrode so as to protect theses from attack by external impurities. But in this embodiment, the role of the passivation layer is substituted for by the inorganic insulating layer 191 which does not lay directly on the source and drain electrodes.

The color filter 181 is deposited and patterned on the insulating substrate 110 which already has formed thereon the source electrode 173 and the drain electrode 175. The color filter 181 covers the data line 171, the drain electrode 175 and the gate insulating layer 141. For example, the color filter 181 may include an organic layer. The organic layer may include a pigment for displaying a color, and a photosensitive organic material. For example, the organic layer includes a photosensitive organic material having red, green or blue pigment.

In one embodiment, color filters 181 having substantially the same color are aligned along a first data line 171. Color filters 181 having a different second color are aligned along a second data line and so forth. The pixel areas have a length to width ratio of about 1:3 so that three differently colored pixel areas (e.g., R, G, B) substantially define a square area. Alternatively, color filters 181 having substantially the same color may be connected with each other to form a belt-shape. The color filters 181 having different colors may be disposed such that edge portions of adjacent color filters 181 may overlap each other on the data line 171. Alternatively, color filters 181 having substantially the same color may be disposed to correspond to a pixel area to have an island shape, and the color filters 181 having the same color may overlap an adjacent color filter 181 having a different color on the data line 171. The color filters of neighboring pixel areas should not overlap with each other on the data lines (171). A light blocking material is formed on a portion of data lines to assure the color filters don't overlap and their lights do not bleed into one another. The portion which the color filters do not overlap may be filled with light blocking material 195. This will improve the flatness (planarity) on the boundary of pixels. This improvement will reduce negative effects of liquid crystal orientation caused by a protrusion The color filter 181 has a first opening 183 disposed on the channel area, a second opening 185 corresponding to the storage electrode 133 and a third opening 187 disposed on the drain electrode 175 and exposing the drain electrode 175. If the color filter 181 had been allowed to be disposed on the channel area, impurities from the color filter 181 may elute toward the channel area, thereby deteriorating electrical characteristics of the TFT. However, as seen in FIG. 2, the inorganic insulating layer 191 is formed on the color filter 181. The color filter has the first opening 183 exposing the channel area. Also, an inorganic insulating layer 191 having an insulating material covers the first opening 183. Examples of the insulating material that can be used for the inorganic insulating layer 191 include a silicon nitride (SiNx), a silicon oxide (SiOx), a silicon oxinitride (SiOxNy), etc. These can be used alone or in a combination. As a result, the electrical characteristics of the TFT are enhanced. The inorganic insulating layer 191 is formed by the following process.

Referring again to FIGS. 1 and 2, the inorganic insulating layer 191 covers an entire upper surface of the color filter 181 as well as inner surfaces of the first opening 183 and the second opening 185 of the color filter 181. For example, the inorganic insulating layer 191 includes a material having a low reaction rate with an organic material, and prevents impurities from eluting therethrough. Examples of the material that can be used for the inorganic insulating layer 191 include silicon nitride (SiNx), silicon oxide (SiOx), etc. For example, the color filter material and the organic insulating material may be decomposed at a low temperature to generate the impurities. However, the material such as silicon nitride (SiNx) or silicon oxide (SiOx) is thermally more stable than the organic material or the color filter material. Thus, display quality may be enhanced.

The inorganic insulating layer 191 covers a channel area disposed in a gap of the first opening 183 of the color filter 181 and enhances the electrical characteristics of the TFT. Additionally, the inorganic insulating layer 191 has an opening 193 disposed on a portion of the drain electrode 175.

Opening 193 of an inorganic insulating layer 191 is for allowing for the connecting of the drain electrode with pixel electrode. Inside of the first opening 183, light blocking material 195 is formed to block light and extend over the channel portion. Pixel electrode 197 is formed on the inorganic insulating material 191 and light blocking material 195. Because the inside of the first opening is filled with light blocking material, the pixel electrode can be formed as a planar structure on the channel portion. Light blocking material can also be formed on the portion of the data lines.

Figure 3:
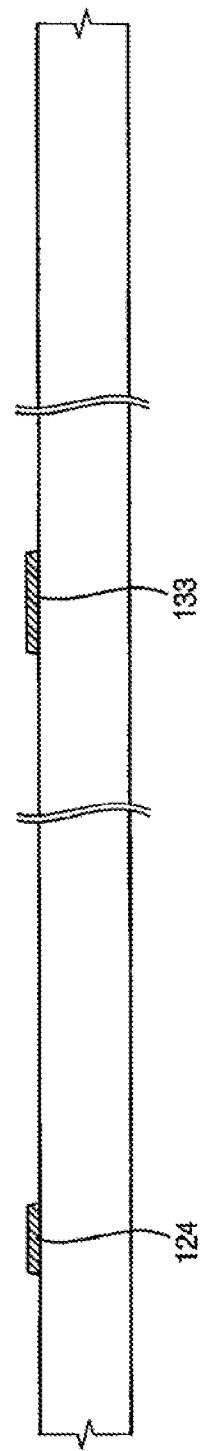
FIGS. 3 to 7 are cross-sectional views illustrating a method of manufacturing a TFT substrate shown in FIG. 1.

FIGS. 3 to 7 are cross-sectional views illustrating a method of manufacturing a TFT substrate shown in FIG. 1. FIG. 3 is a cross-sectional view illustrating a process for forming a gate electrode, gate lines, a storage line, and a storage electrode.

Referring to FIG. 3, the gate lines (not shown), the gate electrode 124, the storage line (not shown), and the storage electrode 133 may be formed by the following method.

A conductive layer (not shown) is formed on an insulating substrate 110. The insulating substrate 110 includes a transparent glass or a polymer. The gate lines (not shown), the gate electrode 124, the storage line (not shown), and a storage electrode 133 are formed by dry etching or wet etching the conductive layer.

For example, the gate lines (not shown) and the storage line (not shown) include a conductive material such as a metal. Examples of the conductive material that can be used for the gate lines (not shown) and the storage line (not shown) may include aluminum (Al), aluminum alloy, silver (Ag), silver alloy, copper (Cu), copper alloy, molybdenum (Mo), molybdenum alloy, chrome (Cr), tantalum (Ta), titanium (Ti), etc. These can be used alone or in combination. In addition, the gate lines 121 and the storage line 131 may include a multi-layered structure having more than two conductive layers (not shown) having different physical characteristics. In the case of copper (CU) for a gateline metal, copper oxide (CuOx) or copper oxinitride (CuON) may be formed between the insulating substrate and the gateline metal. The copper oxide (CuOx) and copper oxinitride (CuON) improves the adhesiveness between the copper layer and insulating substrate.

Figure 4:
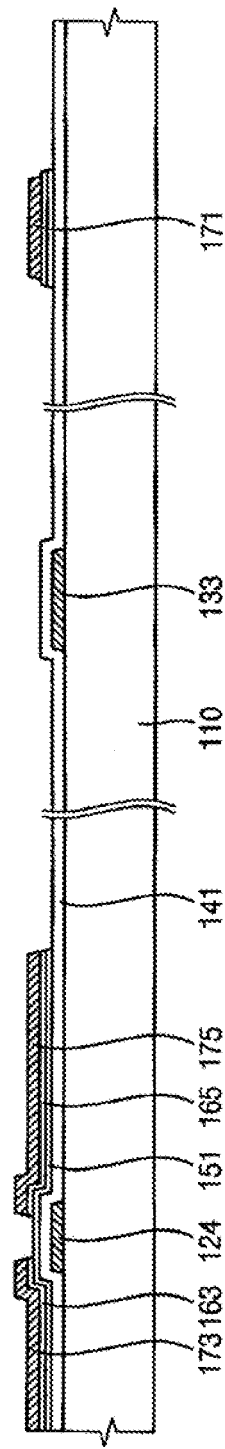

FIG. 4 is a cross-sectional view illustrating a process for forming a semiconductor layer, ohmic contact members, a data line, a source electrode and a drain electrode on the TFT substrate in FIG. 3.

Examples of an insulating material that can be used for the gate insulating layer 141 include a silicon nitride (SiNx), a silicon oxide (SiOx), etc.

The semiconductor layer 151 having a hydrogenated amorphous silicon layer is disposed on the gate insulating layer 141. The semiconductor layer 151 includes a protruding portion that overlaps the gate electrode 124 and a linear portion that overlaps the data line 171.

The ohmic contact members 163 and 165 are disposed on the semiconductor layer 151. The ohmic contact members 163 and 165 are disposed between the semiconductor layer 151 and a source electrode 173. The ohmic contact members 163 and 165 decrease electric contact resistance between the semiconductor layer 151 and the source electrode 173. The ohmic contact members 163 and 165 are also disposed between the semiconductor layer 151 and a drain electrode 175. The ohmic contact members 163 and 165 decrease electric contact resistance between the semiconductor layer 151 and the drain electrode 175.

The data line 171 transmits data signals and is disposed along a substantially perpendicular direction to intersect the gate lines 121. The data line 171 is electrically connected to the source electrode 173 and a data pad (not shown). The source electrode 173 protrudes toward the gate electrode 124. The data pad connected to the conductive pattern formed from the different layer or the external driving circuit is disposed on the end portion of the data line 171. The drain electrode 175 is separated from the data line 171, and faces the source electrode 173. The gate electrode 124 is disposed between the drain electrode 175 and the source electrode 173 when viewed on a plane.

The semiconductor layer 151 has substantially the same shape as the area defined by the data line 171, the drain electrode 175 and ohmic contact layers 163 and 165 under the data line 171 and the drain electrode 175, except for the protruding portion having the TFT. For example, the semiconductor layer 151 is disposed under the data line 171, the drain electrode 175 and ohmic contact layers 163 and 165 that are under the data line 171 and the drain electrode 175. The semiconductor layer 151 is exposed between the source electrode 173 and the drain electrode 175. The ohmic contact layers 163 and 165 have substantially the same shape as an area defined by the data line 171 and the drain electrode 175 when viewed on the plane.

Referring to FIG. 4, the semiconductor layer 151, the ohmic contact members 163 and 165, the data line 171, the source electrode 173 and the drain electrode 175 are formed by the following method.

A silicon nitride layer (not shown), an amorphous silicon layer (not shown) and a doped amorphous silicon layer (not shown) are formed on an insulating layer having a gate line and a storage electrode line formed thereon. For example, the silicon nitride layer (not shown), the amorphous silicon layer (not shown) and the doped amorphous silicon layer (not shown) are formed by a chemical vapor deposition (CVD) method. Then, a conductive layer (not shown) is disposed on the doped amorphous silicon layer by a sputtering method. A photosensitive material is deposited on the conductive layer to form a photosensitive film. The photosensitive material is partially exposed to light. As a result, a first photosensitive pattern (not shown) having a first portion having a first thickness and a second portion having a second thickness that is thinner than the first thickness is formed.

The conductive layer is etched to form a data line pattern (not shown) by dry etching or wet etching by using the first photosensitive pattern as an etching mask. The doped amorphous silicon layer and the amorphous silicon layer are etched to form an ohmic contact pattern (not shown) and the semiconductor layer 151 by dry etching or wet etching using the first photosensitive pattern as an etching mask.

The first photosensitive pattern is etched by a predetermined thickness to form a second photosensitive pattern (not shown) exposing a channel area. The data line pattern is etched by dry etching or wet etching to form the data line 171, the source electrode 173 and the drain electrode 175 by using the second photosensitive pattern as an etching mask.

After removing the second photosensitive pattern, the doped amorphous silicon layer is etched by dry etching or wet etching to form the ohmic contact members 163 and 165. Alternatively, before removing the second photosensitive pattern, the doped amorphous silicon layer may be etched by dry etching or wet etching to form the ohmic contact members 163 and 165, and the second photosensitive pattern may be removed.

In a normal process, a passivation layer would have been formed on the substrate data line, source electrode, and drain electrode to protect these and the channel area from the impurities. But in this embodiment the role of the passivation layer is substituted for by inorganic insulating layer 191.

Figure 5:
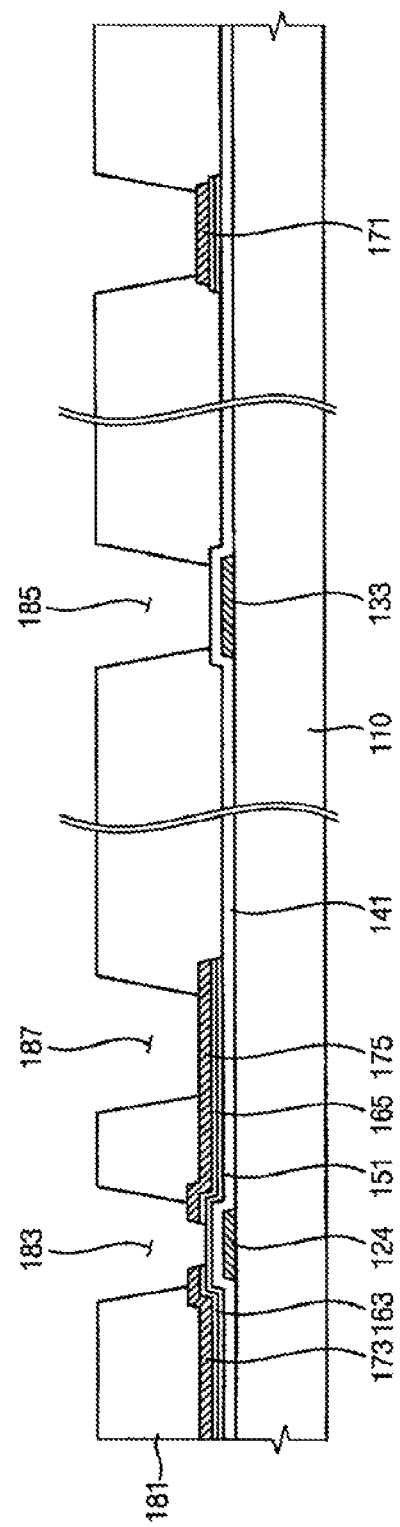

FIG. 5 is a cross-sectional view illustrating a process for forming a color filter on the TFT substrate in FIG. 4.

Referring to FIGS. 1 and 5, the color filter 181 is formed by the following process. For example, a preliminary color filter layer (not shown), or a preliminary organic layer is formed on the insulating substrate 110 having a data line 171 formed thereon by a slit coating method or a spin coating method. The preliminary color filter layer or a preliminary organic layer has a thickness ranging from about 2.5 μm to about 3.5 μm.

The preliminary color filter layer or a preliminary organic layer is exposed to light and is developed to form a color filter such as a red color filter having the first opening 183, the second opening 185 and the third opening 187 as shown.

A color filter having a different color such as green or blue is formed by the same method as described above but in a different pixel area.

After forming the red, green and blue color filters, a plasma treatment process is performed on the insulating substrate 110. For example, the substrate having color filters formed thereon is disposed in a chamber, and plasma is generated in the chamber with a supply gas such as hydrogen ($H_2$) or ammonia ($NH_3$). The plasma process is performed for about 20 seconds to about 60 seconds and with power ranging from about 300 W to about 600 W. Through the plasma process, impurities that may have contaminated the channel area during formation of the color filter may be removed. Thus, electrical characteristics of the TFT may be enhanced.

In general, when the impurities from the color filter having a photosensitive organic material elute through an opening of the pixel electrode, an afterimage may be displayed. In order to prevent the afterimage, the inorganic insulating layer 191 is formed on the color filter 181 after the plasma cleaning step.

The color filter 181 covers the data line 171, the drain electrode 175 and the gate insulating layer 141. For example, the color filter 181 may include an organic layer. The organic layer may include a pigment for displaying a color, and a photosensitive organic material. For example, the organic layer includes a photosensitive organic material having red, green or blue pigment.

For example, the color filters 181 having substantially the same color are aligned along the data line 171. The color filters 181 having different colors are similarly aligned when advancing along the gate line 121. Alternatively, the color filters 181 having substantially the same color may be connected with each other to form a belt-shape. The color filters 181 having different colors may be disposed such that edge portions of adjacent color filters 181 may overlap each other on the data line 171. Alternatively, the color filters 181 having substantially the same color may be disposed to correspond to a pixel area to have an island shape, and the color filters 181 having the same color may overlap an adjacent color filter 181 having a different color on the data line 171. The color filters of neighboring pixel areas do not overlap with each other on the data lines (171). The color filter 181 has a first opening 183 disposed on the channel area, a second opening 185 corresponding to the storage electrode 133 and a third opening 187 disposed on the drain electrode 175 and exposing the drain electrode 175. When the color filter 181 is disposed on the channel area, impurities from the color filter 181 may elute toward the channel area, thereby deteriorating electrical characteristics of the TFT. However, in FIG. 5, the color filter has the first opening 183 exposing the channel area.

Figure 6:
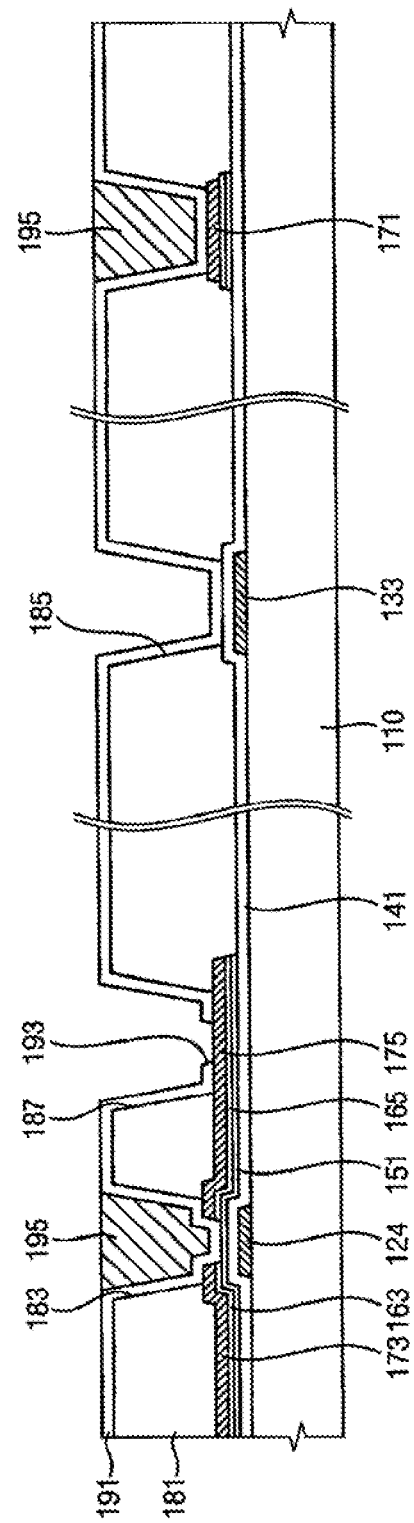

FIG. 6 is a cross-sectional view illustrating a process for forming an inorganic insulating layer 191 on the TFT substrate in FIG. 5.

Referring to FIG. 6, the inorganic insulating layer 191 is formed by the following method.

Also, an inorganic insulating layer 191 covers the first opening 183. Examples of an insulating material that can be used for the inorganic insulating layer 191 include silicon nitride (SiNx), silicon oxide (SiOx), etc. These can be used alone or in a combination. As a result, the electrical characteristics of the TFT are enhanced. The inorganic insulating layer 191 is formed by the following process.

For example, the inorganic insulating layer 191 covers an entire upper surface of the color filter 181 as well as inner surfaces of the first opening 183 and the second opening 185 of the color filter 181. For example, the inorganic insulating layer 191 includes a material having a low reaction rate with an organic material, and prevents impurities from eluting. Examples of the material that can be used for the inorganic insulating layer 191 include silicon nitride (SiNx), silicon oxide (SiOx), etc. For example, the color filter material and the organic insulating material may be decomposed at a low temperature to generate the impurities. However, the material such as silicon nitride (SiNx) or silicon oxide (SiOx) is thermally more stable than the organic material or the color filter material. Thus, display quality may be enhanced.

The inorganic insulating layer 191 is disposed on the color filter 181 to have thin and uniform thickness. For example, when the inorganic insulating layer 191 is disposed at a step portion, the thickness on the step portion may be slightly thinner or thicker than adjacent portions. The inorganic insulating layer 191 corresponds to a profile of the step portion of the color filter 181 under the inorganic insulating layer 191.

For example, the inorganic insulating layer 191 has a predetermined stepped portion according to a shape under the inorganic insulating layer 191. The inorganic insulating layer 191 covers the first and second openings 183 and 185 of the color filter 181 and has a step portion along the first and second openings 183 and 185. A profile of the step portion is substantially the same as those of the first and second openings 183 and 185.

The inorganic insulating layer 191 covers a channel area disposed in a gap of the first opening 183 of the color filter 181 and enhances the electrical characteristics of the TFT. Additionally, the inorganic insulating layer 191 has an opening 193 disposed on a portion of the drain electrode 175.

The inorganic insulating layer 191 is formed on the insulating substrate 110 having the color filter 181 formed thereon by a process such as a chemical vapor deposition (CVD) process. Examples of an inorganic insulating material that can be used for the inorganic insulating layer 191 include silicon nitride (SiNx), silicon oxide (SiOx), etc. The above-mentioned process is performed at a temperature from about 100° C. to about 250° C. For example, the above-mentioned process is performed at a temperature from about 100° C. to about 200° C. When the temperature is higher than about 250° C., the color filter 181 disposed under the inorganic insulating layer 191 may be thermally altered and damaged. When the temperature is lower than about 100° C., the CVD deposition process may deteriorate.

In general, the inorganic insulating layer 191 is formed by a deposition process which takes long to form the inorganic insulating layer 191 having a thickness over about 1 μm. Thus, the inorganic insulating layer 191 has enough thickness to cover only the color filter 181. For example, the inorganic insulating layer 191 has a thickness of about 100 Å to about 2,000 Å, and manufacturing costs and time thereof may decrease.

A photosensitive material is deposited on a substrate having the inorganic insulating layer 191, for example, by a slit coating method or a spin coating method. The photosensitive material is exposed to light and is developed to form a photosensitive pattern. The inorganic insulating layer 191 is dry etched or wet etched by using the photosensitive pattern as an etching mask. As a result, an opening 193 exposes the drain electrode 175, and an opening (not shown) exposes a gate pad and a data pad. An opening may be also formed at the gate insulating layer 141 on the gate pad.

Referring to FIG. 6, the first opening can be filled up by light blocking material after forming the inorganic insulating layer. The light blocking material may include organic material or inorganic material. Through this inclusion of the light blocking material, layer flatness will be enhanced, and the pixel electrode can be extended to the portion corresponding to the channel area. Accordingly, the pixel area aperture will be enhanced and light leakage due to overlay error will be reduced. The light blocking material can be formed inside various combinations or all of the first opening the second opening and the third opening. Also light blocking material can be formed on portions of the data lines where the color filters of neighboring pixel areas don't overlap with each other. For the forming of light blocking material, an inkjet method may be used. In this method, liquid light blocking material is jetted into the opening area. Also a photo lithography process can be used for forming the light blocking material. On the boundary area of each pixel, light blocking material can be exposed to liquid crystals. In this case, the exposed area can be minimized to extend the overlapping portion between the pixel electrode and data lines. When orientating liquid crystals, an inorganic orientation layer can be used. With this, impurities of light blocking material which contaminate liquid crystals can be minimized. A light blocking material is formed on a portion of data lines which the color filters don't overlap. By forming light blocking material on the portion of data lines which the color filters don't overlap, flatness of layers can be enhanced. This will reduce inferiorities of liquid crystal orientation.

Figure 7:
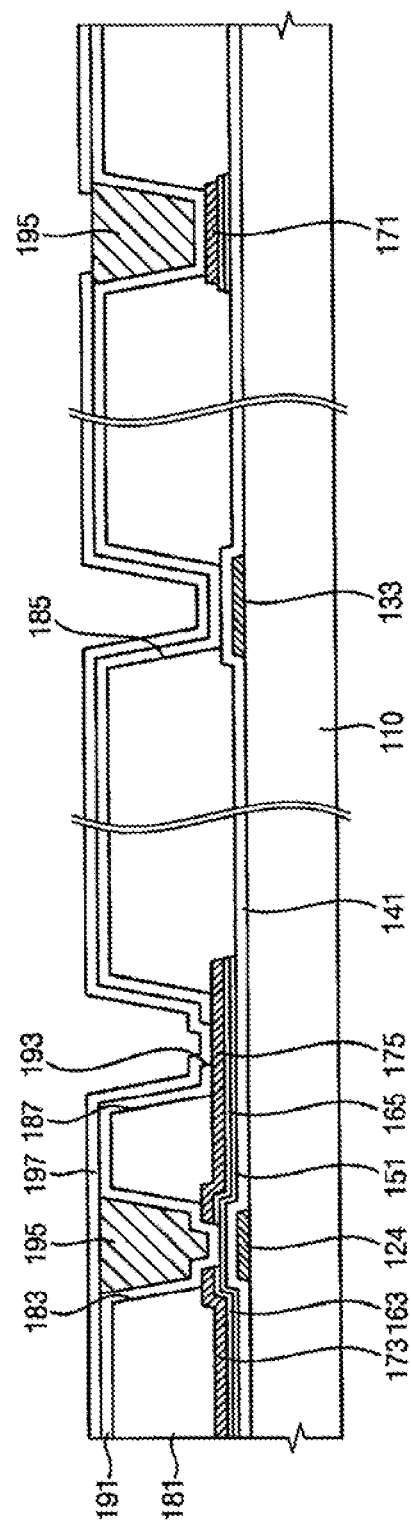

FIG. 7 is a cross-sectional view illustrating a TFT substrate a process for forming a pixel electrode 197 on the TFT substrate of FIG. 6.

Referring again to FIGS. 1 and 7, the pixel electrode 197 is disposed on the inorganic insulating layer 191.

The pixel electrode is not formed at the first opening 183 formed through the color filter 181. The inorganic insulating layer 191 covers the first opening 183. When the pixel electrode 197 is formed in the first opening 183, a parasitic capacitor may be formed and electrical characteristics of the TFT may be deteriorated. In the first opening 183, when the thickness of the inorganic insulating layer 191 decreases, an electrical capacitance of the parasitic capacitor increases. Thus, the pixel electrode 197 may not be formed in the first opening 183.

The pixel electrode 197 formed in an area having the second opening 185 of the color filter 181 and the storage electrode 133 define a storage capacitor Cst with the inorganic insulating layer 191 and the gate insulating layer 141 interposed between the pixel electrode 197 and the storage electrode 133. When the second opening 185 is formed through the color filter 181 under which the storage electrode 133 is formed, a distance between the storage electrode 133 and the pixel electrode 197 is decreased. As a result, an electrical capacitance of the maintaining capacitor Cst may be increased. Thus, although an extra metal electrode is not formed between the storage electrode 133 and the pixel electrode 197, the maintaining capacitor Cst may have stable and sufficient electrical capacitance. But in this disclosure, the $1^{st}$ opening is filled up with light blocking material. So the worries of parasitic capacitance increase will be diminished when the electrode is extended to the portion corresponding to the $1^{st}$ opening.

The pixel electrode 197 is electrically connected to the drain electrode 175 through the third opening 187 of the color filter 181 and the opening 193 of the inorganic insulating layer 191. The pixel electrode 197 covers the opening of the gate pad and the data pad.

For example, the pixel electrode 197 overlaps the gate line 121 and the data line 171. Alternatively, the pixel electrode 197 may not overlap the gate line 121 and the data line 171.

The pixel electrode 197 may be formed by the following method. A transparent conductive layer is disposed on the insulating substrate 110 having the inorganic insulating layer 191 by using a sputtering method. Examples of a transparent conductive material that can be used for the transparent conductive layer include indium zinc oxide (IZO), indium tin oxide (ITO), etc. These can be used alone or in a combination thereof.

On a portion of the storage electrode, ball spacers 210 can be formed. These ball spacers 210 can be formed by an inkjet method. A portion of the storage electrode has enough room for fixing the movement of ball spacers 210. So it will not give any harmful effect of transmittance. This inkjet method doesn't need a photolithography process using a mask which results in saving of manufacturing cost.

Figure 8:
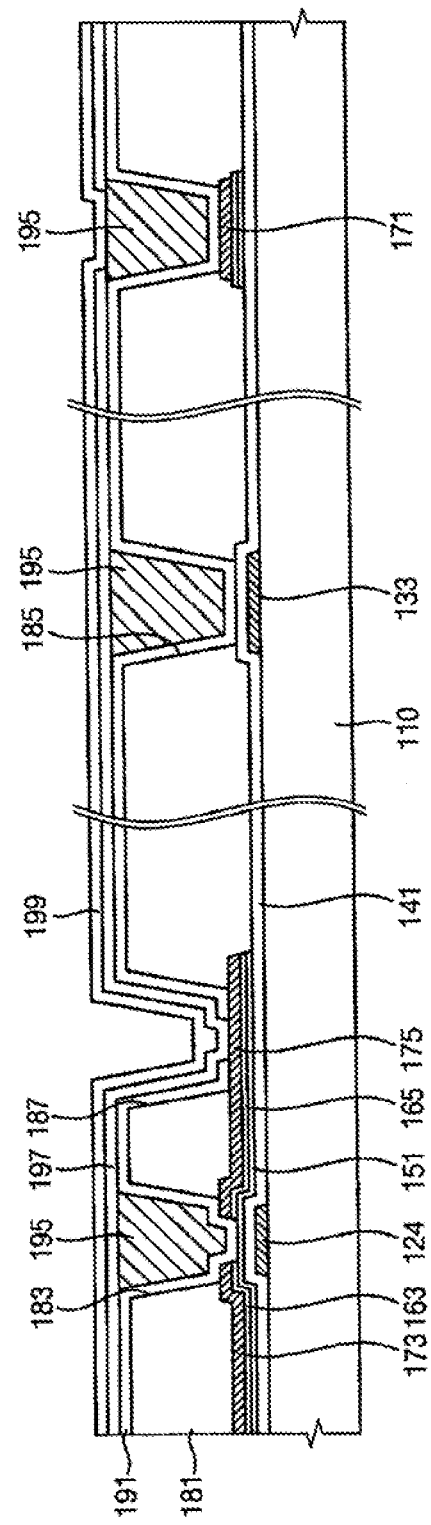
FIG. 8 is a cross-sectional view illustrating a TFT substrate in accordance with a second exemplary embodiment of the present disclosure.

FIG. 8 is a cross-sectional view illustrating a TFT substrate in accordance with a second exemplary embodiment of the present disclosure.

Referring to FIG. 8, a liquid crystal orientation layer is formed on the substrate which the pixel electrode is formed. For the liquid crystal orientation layer, the inorganic liquid crystal orientation layer can minimize the impurities which contaminate the liquid crystal.

A pixel electrode 197 is formed on an inorganic insulating layer 191 and a light blocking material 195.

An alignment layer 199 is formed on the substrate 110 on which the pixel electrode 197 is formed. In FIG. 8, the alignment layer 199 includes an inorganic alignment layer to prevent a liquid crystal layer from being polluted by impurities from the light blocking material 195 through the pixel electrode 197.

Figure 9:
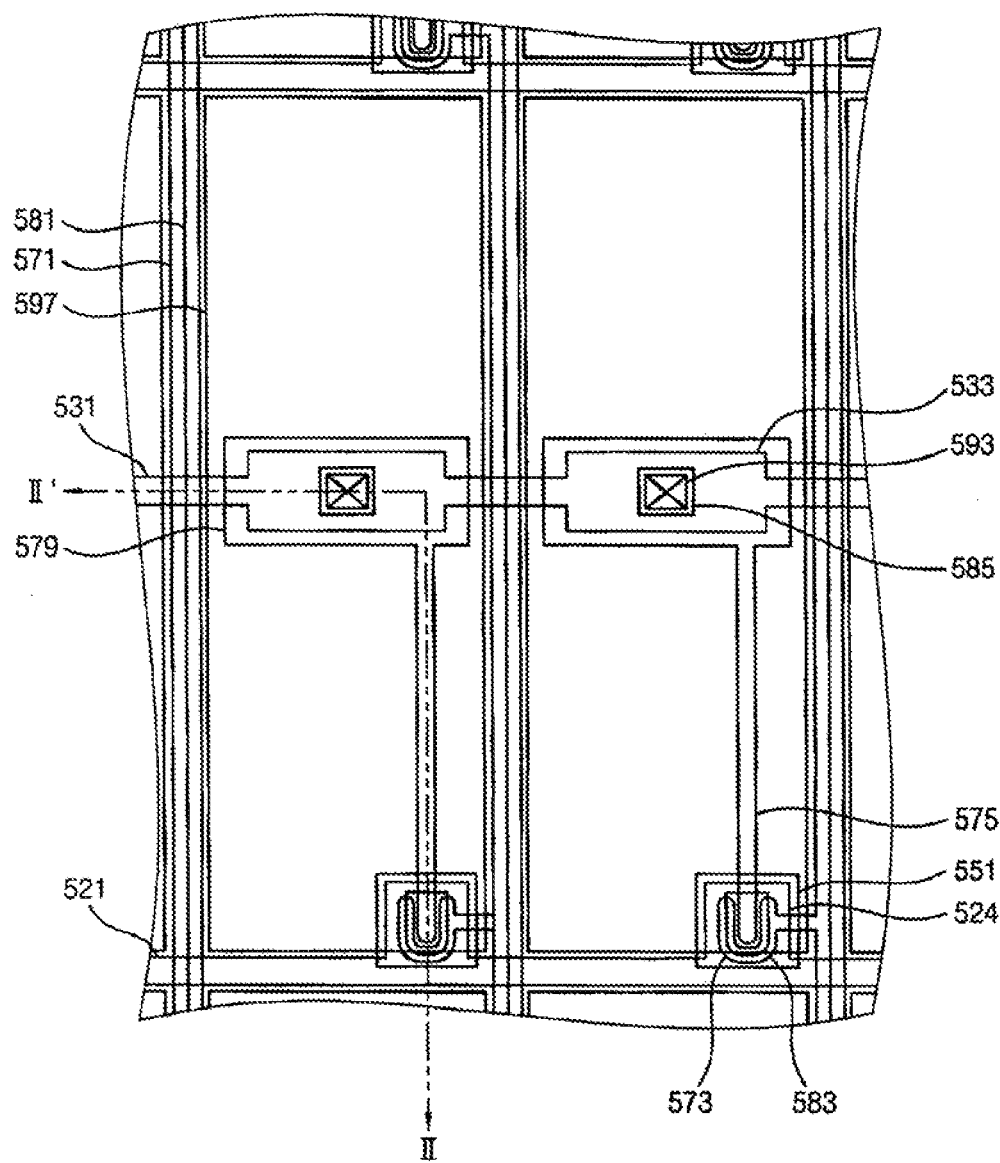
FIG. 9 is a plan view illustrating a portion of a TFT substrate in accordance with a third exemplary embodiment of the present disclosure.
Figure 10:
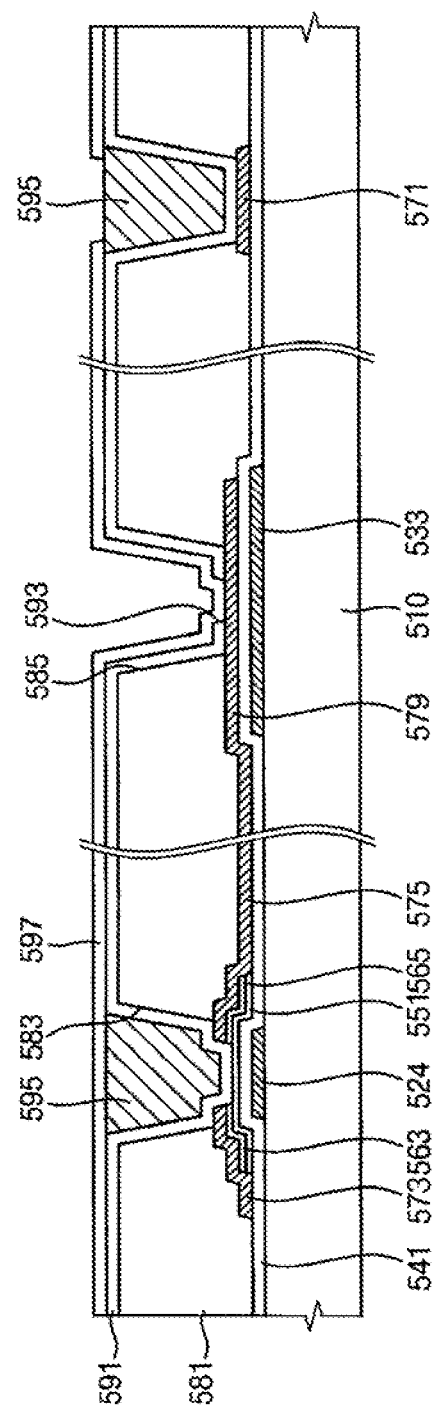
FIG. 10 is a cross-sectional view taken along a line II-II' in FIG. 9.

FIG. 9 is a plan view illustrating a TFT substrate in accordance with a third exemplary embodiment of the present disclosure, and FIG. 10 is a cross-sectional view taken along the line II-II' in FIG. 9.

Referring to FIG. 9, a plurality of gate lines 521 is disposed on an insulating substrate 510. The insulating substrate 510 includes, for example, a transparent glass or a polymer.

The gate lines 521 are disposed along a horizontal direction and transmit gate signals. Each of the gate lines 521 includes a gate electrode 524 and a gate pad (not shown). The gate electrode 524 protrudes from the gate lines 521 along a direction that is substantially perpendicular to the longitudinal direction of the gate lines 521. The gate pad is disposed on an end portion of the gate lines so as to be electrically connected to a conductive pattern formed from a different layer or an external driving circuit.

A storage line 531 including a storage electrode 533 is formed from substantially the same layer as the gate lines 521. The storage electrode 533 may have various sizes and shapes as deemed appropriate. For example, the storage electrode 533 in the present exemplary embodiment may have a rectangular shape on a central portion of a pixel electrode.

The gate line 521 and the storage line 531 may include metal or conductive material. For example, the gate line 521 and the storage line 531 may be formed by depositing a conductive layer (not shown) on a transparent glass or a transparent plastic and dry or wet etching the conductive layer.

A gate insulating layer 541 is formed on the substrate 110 on which the gate line 521 is formed. The gate insulating layer 541 may include silicon nitride (SiNx) or silicon oxide (SiOx). A semiconductor layer 551 is formed on the gate insulating layer 541. The semiconductor layer 551 may include amorphous silicon.

The semiconductor layer 551 is overlapped with the gate electrode 524, and may have an island shape.

An ohmic contact pattern 563 and 565 is formed on the semiconductor layer 551. The onmic contact pattern 563 and 565 is interposed between the semiconductor layer 551 and the source electrode 573 and between the semiconductor layer 551 and the drain electrode 575 to decrease resistance between the semiconductor layer 551 and the source electrode 573 and between the semiconductor layer 551 and the drain electrode 575. The ohimc contact pattern 563 and 565 is overlapped with the semiconductor layer 551, and has island shapes. The ohmic contact pattern 563 and 565 exposes a portion of the semiconductor layer 551 between the source electrode 573 and the drain electrode 575.

Data lines 571 and the drain electrode 575 are formed on the substrate 110 on which the ohmic contact pattern 563 and 565 is formed.

The data lines 571 are formed after forming gate lines. Source electrode 573 protrudes from the data lines 571 along a direction that is substantially perpendicular to the horizontal direction of the data lines 571. Drain electrode 575 is formed spaced apart from the source electrode 573 to define a channel therebetween.

In this embodiment the pixel electrode 597 is electrically connected to portion 579 of the drain electrode 575 through the third opening 585 of the color filter 181 and through the opening 593 thereat of the inorganic insulating layer 591.

Referring to FIG. 10, the shape of the drain electrode is different from the other embodiments discussed thus far. The drain electrode 575 is spaced apart in FIG. 9 from the data line 571 and it faces from up top into the U-shaped source electrode 573 while also running in the same extension direction as the underlying gate electrode 524. The drain electrode 575 and the source electrode 573 are disposed over the gate electrode 524. The drain electrode 575 includes an extended end portion 579 that overlaps the storage electrode line 533 to form a storage capacitor, Cst. In one embodiment, the extended end portion 579, for example, is disposed on a center of the pixel area and has a substantially rectangular shape.

Figure 11:
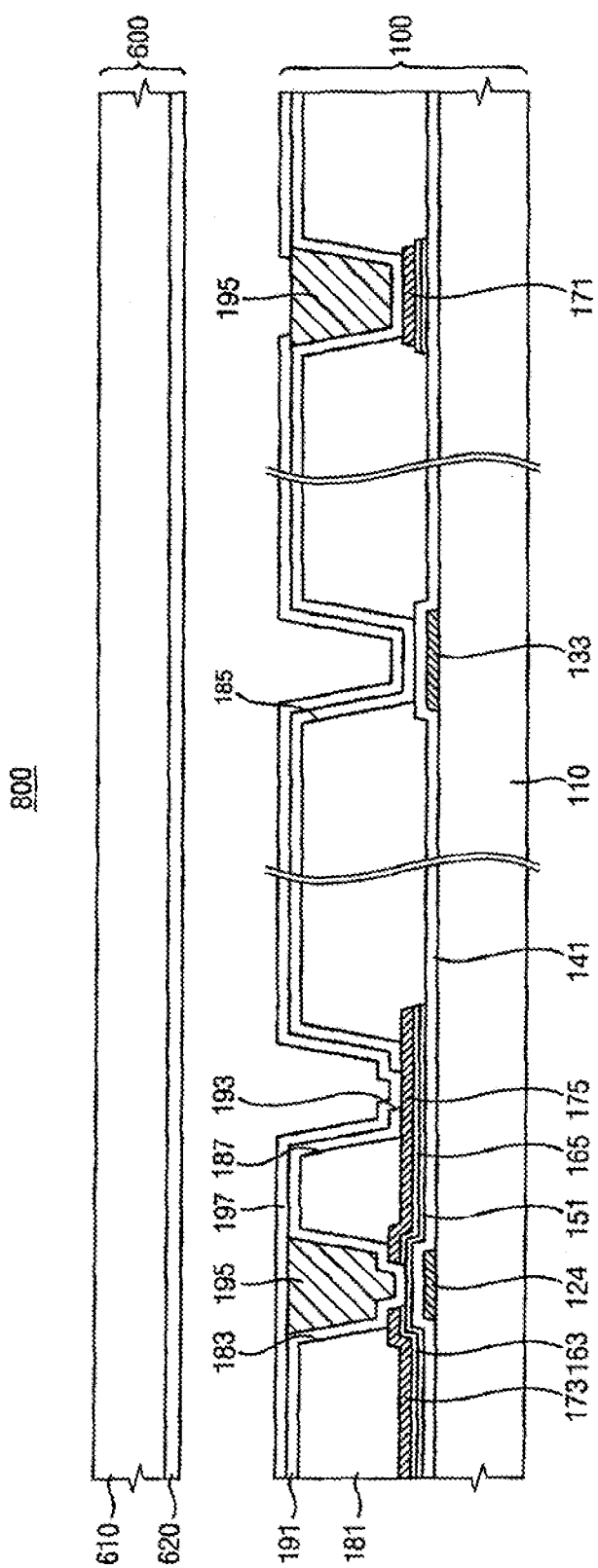
FIG. 11 is a cross-sectional view illustrating a display apparatus in accordance with an exemplary embodiment of the present disclosure.

FIG. 11 is a cross-sectional view illustrating a display apparatus in accordance with an exemplary embodiment of the present disclosure.

Referring to FIG. 11, a display apparatus 800 in accordance with the one exemplary embodiment includes a TFT substrate 100, a common electrode substrate 600 and a liquid crystal layer (not explicitly hatched or referenced) disposed between the TFT substrate 100 and the common electrode substrate 600.

The TFT substrate 100 of FIG. 11 is understood to be the same as that shown in FIGS. 1 and 2. Thus, the same reference numerals will be used to refer to the same or like parts as those described in FIGS. 1 and 2 and any further explanation concerning the above elements will be omitted.

The common electrode substrate 600 includes a light passing insulating substrate 610 and a light passing common electrode 620 disposed on the insulating substrate 610.

In one embodiment, the common electrode 620 is a transparent conductive material. Examples of the transparent conductive material that can be used for the common electrode 620 include indium zinc oxide (IZO), indium tin oxide (ITO), etc. These can be used alone or in a combination.

The liquid crystal layer (not shown) is disposed between the TFT substrate 100 and the common electrode substrate 600.

Examples of the liquid crystal mode of the liquid crystal layer include a patterned vertical alignment (PVA) mode, a twisted nematic (TN) mode, an optically compensated bend (OCB) mode, etc. According to the liquid crystal mode, liquid crystal molecules are arranged vertically or horizontally.

According to a TFT substrate and a display apparatus of the present disclosure, an inorganic insulating layer is disposed so as to cover a color filter and prevent leakage of material from the color filter to the liquid crystal layer. Thus, impurities from the color filter may be blocked, from contaminating the liquid crystal layer, thereby reducing defects such as afterimage creation.

According to a method of manufacturing the TFT substrate of one embodiment, an inorganic insulating layer is formed at a low temperature of about 100° C. to about 250° C. Thus, damage to a lower color filter may be prevented and display quality may be enhanced.

Furthermore, according to a method of manufacturing the TFT substrate of one embodiment, the thickness of the inorganic insulating layer is minimized so as to decrease the manufacturing time for CVD deposition of the inorganic insulating layer on the TFT substrate.

Although exemplary embodiments have been described herein with reference to the accompanying drawings, it is to be understood that the present disclosure should not be limited to those precise embodiments and that various other changes and modifications may be made by one of ordinary skill in the related art after appreciating the above without departing from the scope or spirit of the disclosure.

What is claimed is:

1. A method of mass producing a plurality of TFT supporting substrates, the method comprising for each TFT supporting substrate:
    providing a light passing substrate layer having a plurality of pixel areas;
    forming a set of signal lines on the substrate layer, the set of signal lines comprising a data line, and comprising for each pixel area, a source electrode and a spaced apart drain electrode;
    forming a semiconductive portion to which the source and drain electrodes are coupled, where a channel portion is defined in the semiconductive portion between the spaced apart source and drain electrodes;
    forming a color filter layer in direct contact with the signal lines, the color filter layer having for each pixel area, a corresponding first opening defined through the color filter layer and disposed over the corresponding channel portion of the respective pixel area;
    forming an inorganic insulating layer on the color filter layer to thereby seal the color filter layer, said inorganic insulating layer extending into an interior of each of the first openings of said pixel areas;
    forming a light blocking material on the inorganic insulating layer, said light blocking material extending into an interior of each of the first openings of said pixel areas and covering the corresponding channel portion; and
    forming for each pixel area, a pixel electrode disposed on the inorganic insulating layer and on the light blocking material, where the pixel electrode connects electrically to the corresponding drain electrode of the pixel area and where the pixel electrode covers at least a portion of the light blocking material disposed in the interior of the corresponding first opening of the pixel area.

2. The method of claim 1, further comprising:
    after forming the color filter layer, cleaning a surface of the in-process TFT supporting substrate with a plasma cleaning process.

3. The method of claim 2, wherein the plasma cleaning process uses at least one gas selected from the group consisting of hydrogen (H2) gas and ammonia (NH3) gas.

4. The method of claim 3 and further comprising:
    forming a gate insulating layer over the light passing substrate layer;
    forming, as part of said semiconductive portion, an amorphous silicon layer on the gate insulating layer;
    forming, as part of said semiconductive portion, a doped amorphous silicon layer on the amorphous silicon layer;
    forming a conductive layer on the doped amorphous silicon layer;
    forming a first photosensitive pattern on the conductive layer;
    etching the conductive layer to form a data line pattern by using the first photosensitive pattern as an etching mask;
    etching the amorphous silicon layer and the doped amorphous silicon layer by using the first photosensitive pattern or the data line pattern as an etching mask;
    forming a second photosensitive pattern by partially removing the first photosensitive pattern by a uniform thickness; and
    exposing the amorphous silicon layer by etching the data line pattern by using the second photosensitive pattern as an etching mask.

5. The method of claim 1, wherein:
    the forming for each pixel area of a corresponding pixel electrode includes causing the pixel electrode to have a planar structure over the channel portion.

* * * * *